US009125291B2

(12) United States Patent
Lohman

(10) Patent No.: US 9,125,291 B2
(45) Date of Patent: Sep. 1, 2015

(54) COVER FOR ELECTRONIC EQUIPMENT COMPRISING CONTACTING DEVICE

(75) Inventor: Bertil Lohman, Sollentuna (SE)

(73) Assignee: CLAMCO INVEST AB, Sollentuna (SE)

( * ) Notice: Subject to any disclaimer, the term of this patent is extended or adjusted under 35 U.S.C. 154(b) by 800 days.

(21) Appl. No.: 13/503,376

(22) PCT Filed: Oct. 21, 2010

(86) PCT No.: PCT/SE2010/051140
§ 371 (c)(1),
(2), (4) Date: May 23, 2012

(87) PCT Pub. No.: WO2011/049526
PCT Pub. Date: Apr. 28, 2011

(65) Prior Publication Data
US 2012/0223030 A1    Sep. 6, 2012

(30) Foreign Application Priority Data
Oct. 23, 2009   (SE) .................................. 0950788

(51) Int. Cl.
H05K 9/00    (2006.01)
(52) U.S. Cl.
CPC ............ *H05K 9/0016* (2013.01); *H05K 9/0009* (2013.01)
(58) Field of Classification Search
CPC ........ B65D 7/24; B65D 7/32; B65D 11/1873; H05K 9/00; H05K 9/0009; H05K 9/0015; H05K 9/0016

USPC ............... 220/4.28, 4.31, 4.32; 174/366, 367, 174/368, 369, 384, 559, 560, 563, 564; 361/816, 818
See application file for complete search history.

(56) References Cited

U.S. PATENT DOCUMENTS

| | | | | |
|---|---|---|---|---|
| 2,119,799 A | * | 6/1938 | Sivey | 126/9 R |
| 2,332,299 A | * | 10/1943 | Cohn | 220/4.28 |
| 2,546,086 A | * | 3/1951 | Brockway | 200/314 |
| 2,759,622 A | * | 8/1956 | Simmons et al. | 220/4.28 |
| 2,862,640 A | * | 12/1958 | Somavia | 220/4.31 |
| 3,019,333 A | * | 1/1962 | Pascucci | 362/355 |
| 3,052,821 A | * | 9/1962 | Scoville | 174/535 |
| 3,316,460 A | * | 4/1967 | Scoville | 361/796 |
| 3,677,433 A | * | 7/1972 | Collins | 220/4.01 |

(Continued)

OTHER PUBLICATIONS

International Search Report, dated Jan. 20, 2011, from corresponding PCT application.

*Primary Examiner* — Michael Safavi
(74) *Attorney, Agent, or Firm* — Young & Thompson

(57) ABSTRACT

Cover for an electronic equipment, which cover includes a first and a second metal panel element, wherein respective first and second metal surface of the panel element are mechanically joined together with electrical contact using a connector including a contacting device. The contacting device includes a) an elongated, wave-shaped metal compression spring part with a direction of elongation and a direction of motion, where the spring part is compressed between the two respective metal surfaces against the spring force; b) a hook part on the spring part, gripping around an edge of the first panel element; and c) at least one projection, on a surface facing towards the first metal surface when the hook part grips around the edge, which projection is arranged to display different sliding friction against the first metal surface depending on in which direction the spring part is caused to slide against the first metal surface.

12 Claims, 9 Drawing Sheets

(56) References Cited

U.S. PATENT DOCUMENTS

| | | | | |
|---|---|---|---|---|
| 4,009,796 A * | 3/1977 | Schmidt | | 220/668 |
| 4,322,572 A * | 3/1982 | Snyder | | 174/368 |
| 4,711,361 A * | 12/1987 | Mischenko | | 220/4.28 |
| 4,752,861 A * | 6/1988 | Niggl et al. | | 361/692 |
| 4,780,570 A * | 10/1988 | Chuck | | 174/369 |
| 4,788,381 A * | 11/1988 | Nilsson | | 174/368 |
| 4,840,285 A * | 6/1989 | Carr | | 220/4.02 |
| 5,004,866 A * | 4/1991 | Cooke et al. | | 174/366 |
| 5,039,825 A * | 8/1991 | Samarov | | 174/366 |
| 5,278,351 A * | 1/1994 | Herrick | | 174/372 |
| 5,382,753 A * | 1/1995 | Farley | | 174/563 |
| 5,398,833 A * | 3/1995 | Klauss et al. | | 220/4.02 |
| 5,555,980 A * | 9/1996 | Johnston et al. | | 206/600 |
| 5,825,634 A * | 10/1998 | Moorehead, Jr. | | 361/816 |
| 5,913,583 A * | 6/1999 | Zachoszcz | | 312/263 |
| 6,015,195 A * | 1/2000 | Anderson et al. | | 312/223.2 |
| 7,276,663 B1 * | 10/2007 | Johnson et al. | | 174/66 |
| 2002/0085363 A1* | 7/2002 | Mu-Tsai | | 361/816 |
| 2007/0153489 A1* | 7/2007 | Fan et al. | | 361/753 |

\* cited by examiner

COVER FOR ELECTRONIC EQUIPMENT COMPRISING CONTACTING DEVICE

The present invention relates a cover for electronic equipment.

Typically, electronic equipment is arranged in the form of individual units, comprising a plurality of electronic components. Such components give rise to disturbing electromagnetic noise of various frequencies, which may interfere with other electronic components, even components arranged in other units.

Therefore, it is desirable that each such unit with electronic equipment is shielded electrically to avoid that such electromagnetic disturbance from other units interfere with the operation of the equipment, and to avoid that other units are negatively affected by disturbances from the equipment.

It is common for several units to be arranged near each other in stands. A commonly used form factor for such rack systems is the European 19 inch standard.

In order to keep the price down on such covers for electronic equipment, it is important that a solution to achieve good shielding is not too complicated. Since there are demands on the cover being able to quickly and securely be mounted and demounted, opened and resealed, without risking the shielding properties. This is especially true in the case with industrially used electronic units, such as for example many units of 19 inch type, where there is a need for easy access to the interior of the cover, during installation of electronic components, etc.

Moreover, there are demands that the shielding should be effective over a constantly expanding frequency spectrum for electromagnetic disturbance.

In order to solve these problems, covers comprising a large number of bolted joints have previously been proposed in order to improve the electric contact between different parts of the cover.

The present invention solves the above described problems.

Thus, the invention relates to a cover for an electronic equipment, which cover comprises a first and a second metal panel element, where respective first and second metal surfaces of the said panel elements are arranged to be mechanically joined together with good electric contacting using a connector comprising a contacting device, and is characterised in that the contacting device comprises a) an elongated metal compression spring part, associated with a direction of elongation and also a direction of motion along the said direction of elongation, which spring part is wave-shaped whereby it comprises a plurality of alternating crests and valleys, so that the spring part is arranged to be compressed, against the spring force, between the two respective metal surfaces in a press plane which is perpendicular to the direction of the spring force, whereby the outsides of the crests are pressed against the first metal surface and the outsides of the valleys are pressed against the second metal surface; b) a hook part arranged on the spring part, arranged to grip around an edge of the first panel element and thereby, when it grips around the edge, prevent that the part of the contacting device being retained by the hook part is displaced in the said direction of movement in relation to the first metal surface; and c) at least one projection, arranged on a surface facing the first metal surface when the hook part grips around said edge, which projection is arranged to display relatively low sliding friction against the first metal surface when the spring part is caused to slide against the first metal surface in the said direction of motion and a relatively high sliding friction when the spring part is caused to slide in the opposite direction, where the latter relatively high sliding friction is higher than the sliding friction between the side of the spring part facing the second metal surface and the second metal surface when the spring part is compressed between the two metal surfaces.

In the following, the invention will be described in detail, with reference to exemplifying embodiments of the invention and to the enclosed drawings, where:

FIG. 2b is an exploded perspective view of the cover of FIG. 2a;

FIG. 3d is a side view of the spring of FIG. 3a;

In all figures, the same reference numerals denote the same or corresponding parts.

Figure 1:
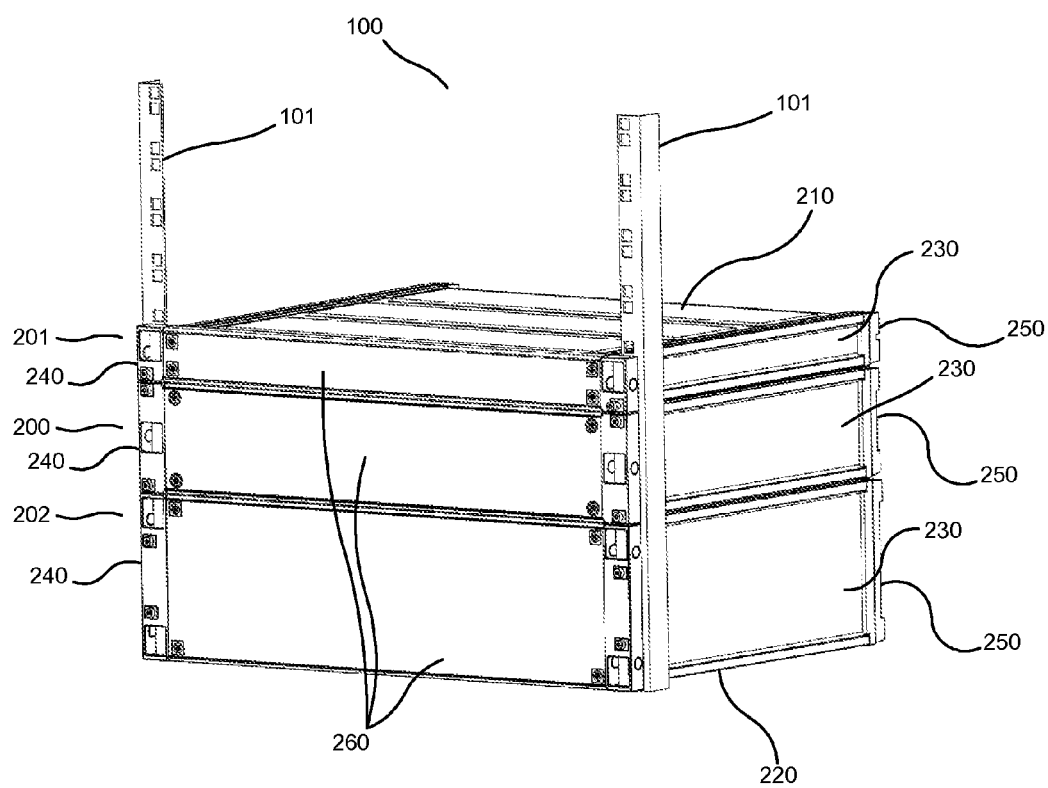
FIG. 1 is a perspective view of three different covers mounted in a rack of 19 inch type.

FIG. 1 shows a rack system 100 of 19 inch standard, comprising a stand 101 in which three covers 200, 201, 202 for electronic equipment are mounted.

Figure 2A:
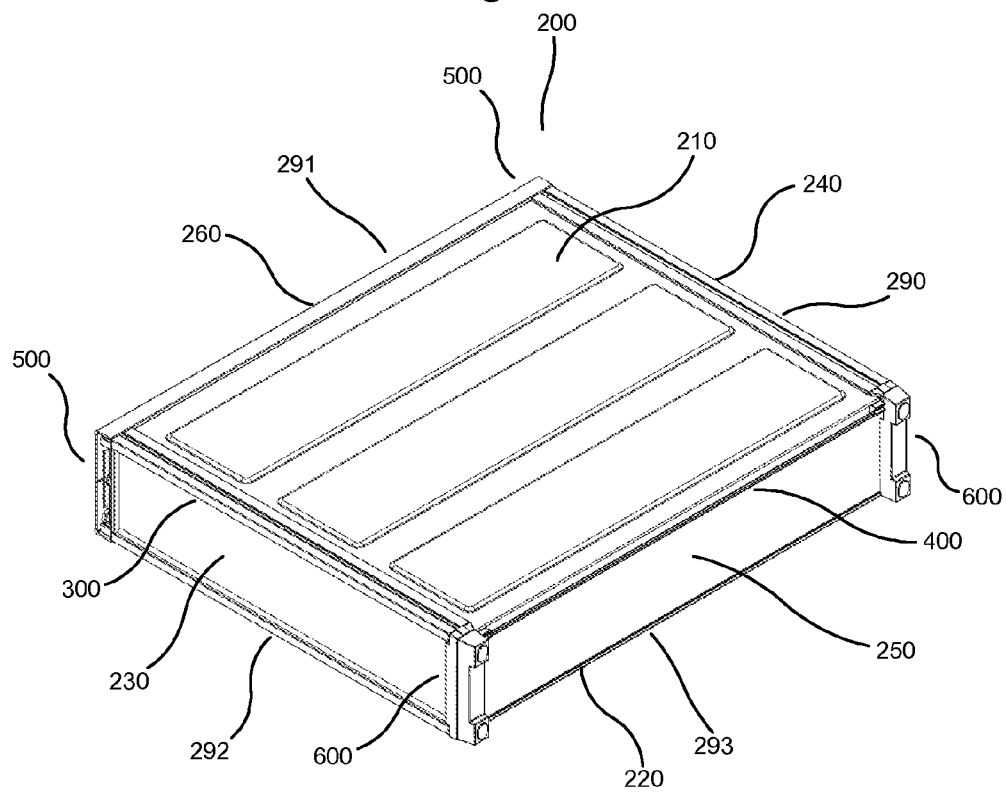
FIG. 2a is a perspective view of a cover.

The middle cover 200 is illustrated in closer detail in FIG. 2a. The cover 200, which is made of an electrically conducting material, preferably metal, comprises a top panel 210, a bottom panel 220, a first side panel 230, a second side panel 240, a rear panel 250 and a front panel 260. Some, but not all, of the panels may be permanently fastened one to the other at the joints along which they meet. These panels may be made from a single metal piece, or be permanently joined together in any other way. At least a pair, preferably all, panels are however movable in relation to each other, and are arranged to be joinable, and therefore to be fixed and immobile in relation to each other, along with the said joints, using respective jointing means, for example comprising mounting screws.

The cover 200 assumes the shape illustrated in FIG. 1 when all panels which are movable in relation to each other are joined together in this manner.

It is preferred that the cover is shaped as a rectangular parallelepiped, in which each surface of the rectangular parallelepiped corresponds to a panel element which is jointed to the other panel elements, so that altogether six panel elements and twelve connectors are arranged in the cover. This results in uncomplicated jointing geometries and adequate contacting along all joints in the cover.

According to the invention, at least two panels, preferably all panels that are arranged pairwise adjacent to and mobile in relation to each other, are arranged to be joined together using a respective one such connector, which is arranged to achieve both mechanical jointing a well as good electric contacting along each of the joints along which the respective panel elements are joined together.

In FIG. 2a, the following connectors are indicated:

Between on the one hand the top panel 210 and on the other hand the side panel 300, the rear panel 400, the second side panel 290 and the front panel 291, respectively;

between on the one hand the bottom panel 220 and on the other hand the first side panel 292 and the rear panel 293, respectively;

between respective side panels and the rear panel 600;

between respective side panels and the front panel 500.

In the present exemplary embodiment, the connectors between on the one hand the bottom panel 220 and on the other hand both the side panels 230, 240 are identical to the corresponding connector between on the one hand the top panel 210 and on the other hand the side panels 230, 240.

Figure 2B:
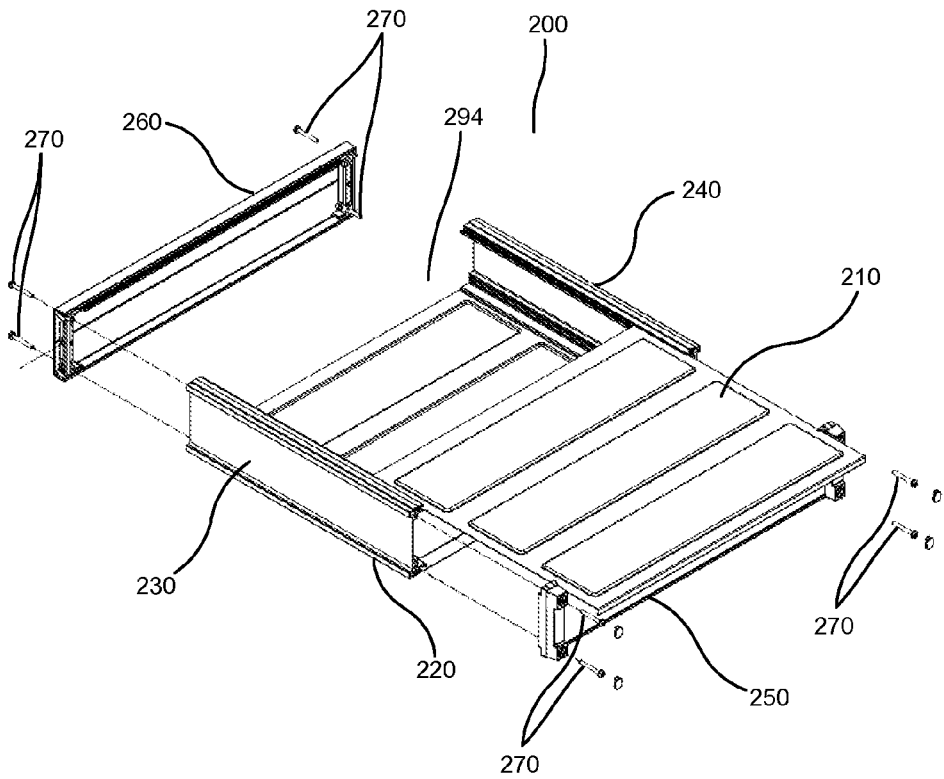
Figure 3A:
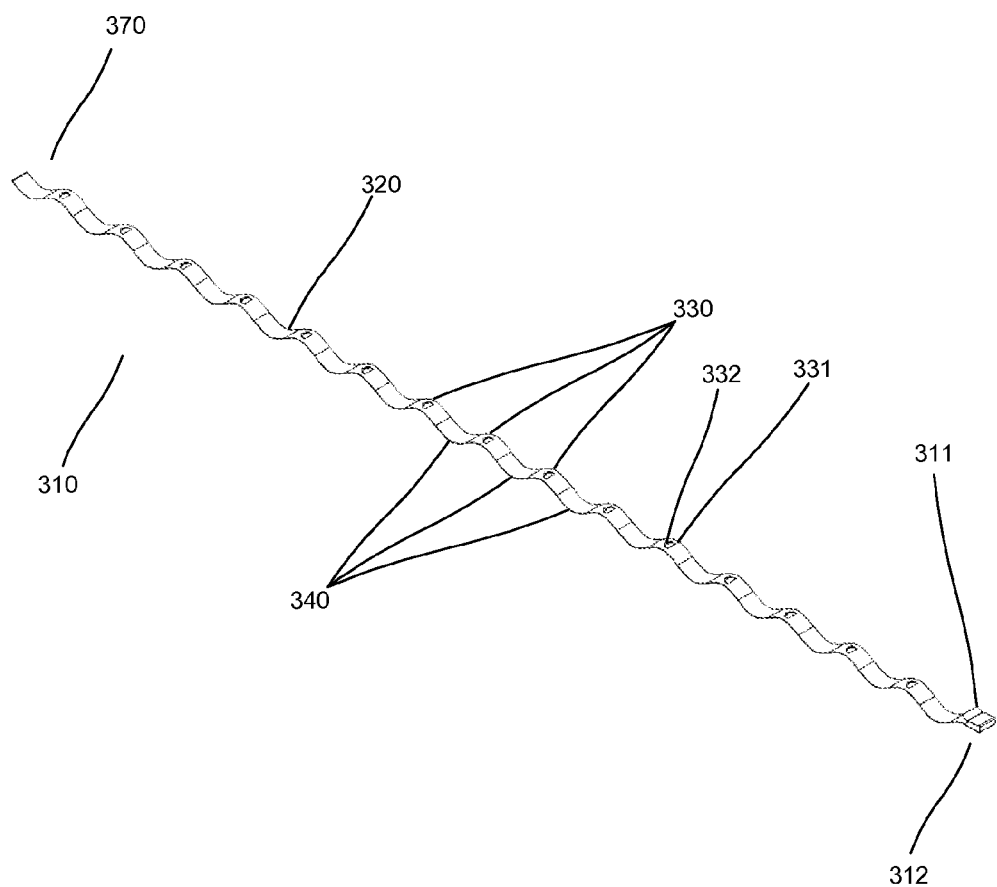
FIG. 3a is a perspective view of a first contacting device in the form of a spring.
Figure 3B:
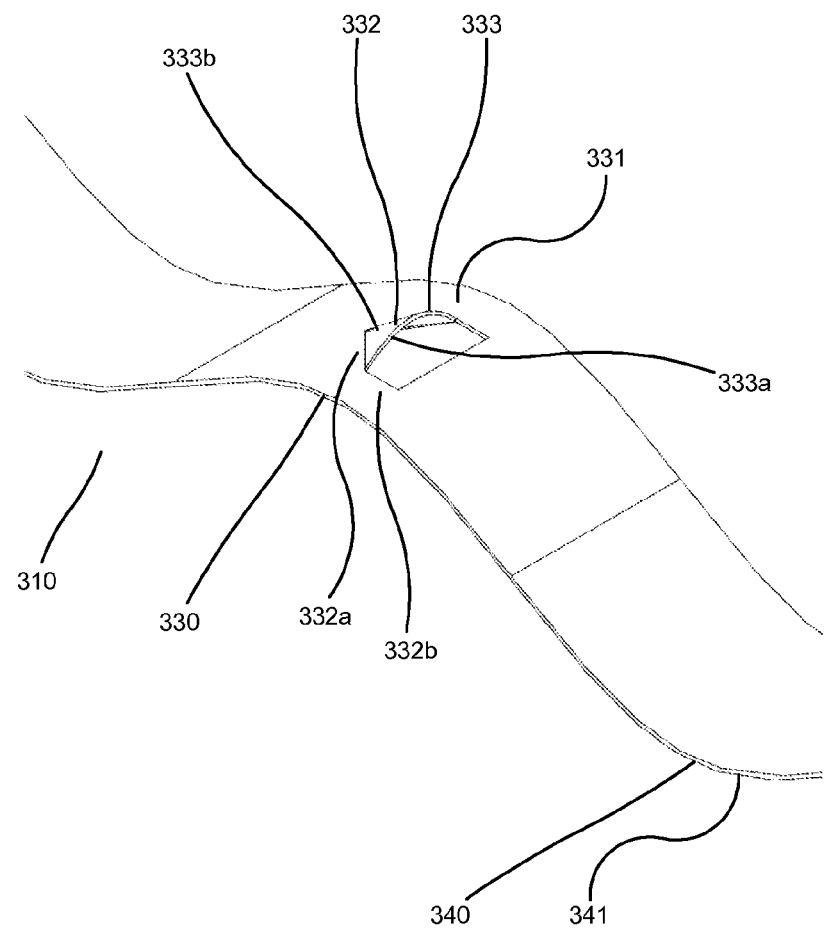
FIG. 3b is a detail view of a projection of the spring of FIG. 3a in perspective.
Figure 3C:
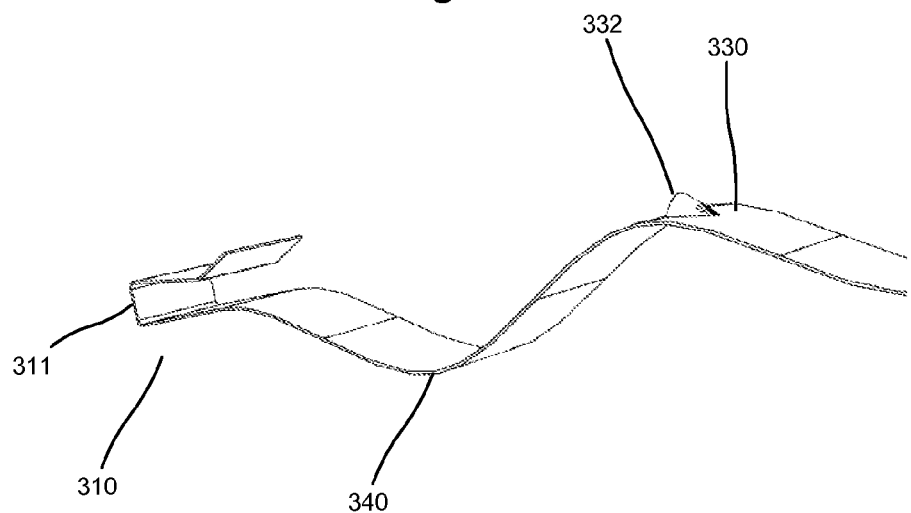
FIG. 3c is a detail view of a hook part of the spring of FIG. 3a in perspective.
Figure 3D:
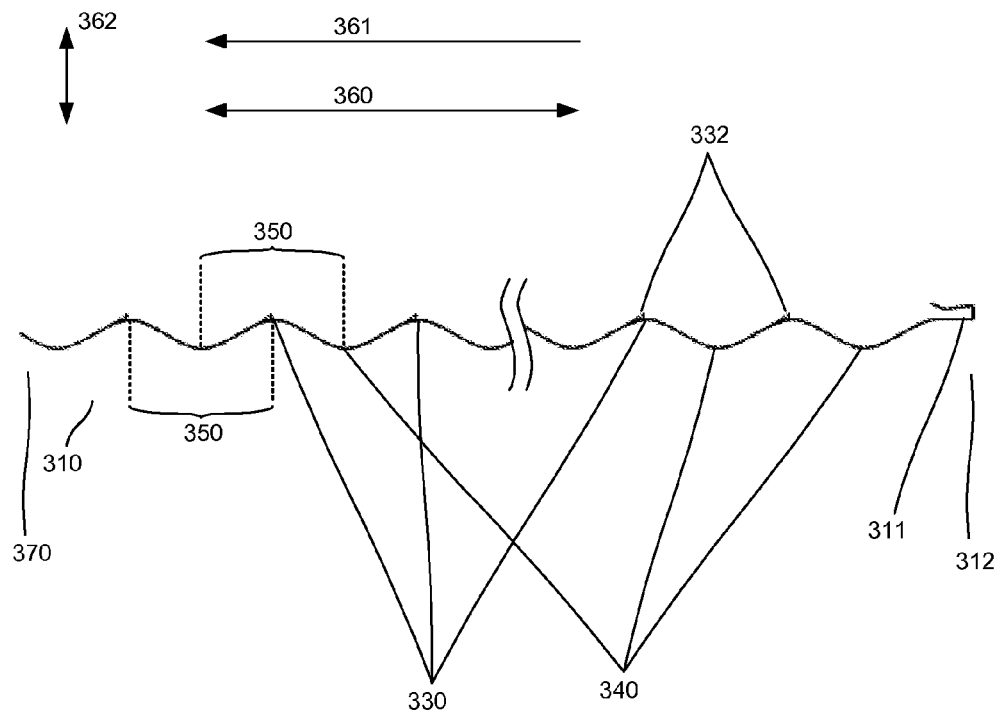
Figure 3E:
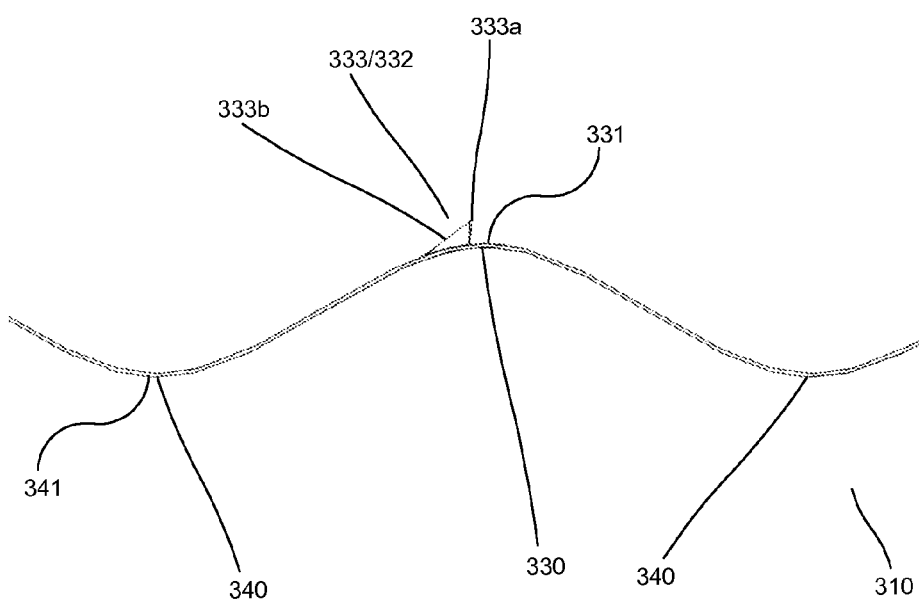
FIG. 3e is a detail side view of a part of the spring of FIG. 3d.

FIG. 2b illustrates the cover 200 in FIG. 2a partly exploded, where also fastening screws 270 for joining the respective panels together are shown.

It is preferred that each respective connector comprises a resilient contacting device in the form of an electrically conducting material, preferably metal, between panels that are movable in relation to each other. When two panel elements are joined together using such a connector, the contacting device is arranged between the respectively joined together panel elements and in direct contact with the respective side surface of both the respective panel elements. As will be described in detail in the following, in connection to the description of preferred embodiments, the resilient contacting device is designed so that it in this state is compressed against and overcoming its spring force, so that this spring force acts against the surfaces of both the respectively joined together panel elements, and connects them electrically one to the other. In other words, the contacting device is arranged to be pressed against both the joined together panels at the same time and thereby acting as a bridge between them, and the electric connection arises as a consequence of the contacting device, as well as the panels, being of metal material.

As will also be described in detail in the following, each contacting device is furthermore designed so that the contact surface which is present between the contacting device in question and each of the respective contacting panels is limited to a series of projections from the contacting device towards the respective panel when the panels are joined together using a connector comprising the contacting device.

According to a preferred embodiment, each contacting device furthermore comprises a metal spring part, which may be designed in different ways along different joints.

FIGS. 3a-3e illustrate a contacting device according to the present invention, comprising a hook spring device 310 comprising such a spring part 320, which is preferably used in connectors where the joining together is arranged to be executed by an edge of a first panel being pushed in parallel along one or two corresponding edges of one or two other panels, in order to be locked in its position when all panels are aligned. In the cover 200, there are such connector arranged in the connectors 290, 292, 300 being arranged between on the one hand the top 210 and bottom 220 panels and on the other hand the first 230 and the second 240 respective side panel.

The spring part 320 is designed as an elongated, wave-shaped compression spring part, arranged to be positioned with its direction of elongation 360 oriented along the main direction of elongation of the connector along the joint between two adjacent panels. Preferably, the spring part 320 is in the form of a wave-shaped band, which comprises a plurality of alternating crests 330 and valleys 340 in the profile illustrated in FIG. 3d. It is preferred that the wave-shape is sinusoidal, so that the crests and valleys are evenly distributed and recur periodically along the whole length 360.

The reference numeral 350 denotes the distance, in the direction of elongation, between two adjacent crests or valleys, respectively, when the spring part is sinusoidal.

The wave-shape results in that the spring part can be compressed against a spring force acting in a direction 362, perpendicular to the direction 360 of elongation. During such compression, the spring part will be extended in the direction of elongation, so that its ends 312, 370 are displaced away from each other.

Each crest comprises a respective outside 331, and each valley comprises a respective outside 341. When the spring part 320 is mounted in the connector, it is arranged to, against the spring force, be compressed, between the two respective panels that are joined together using the connector, in a press plane which is perpendicular to the wave-shape and therefore also to the direction 362 of the spring force. In other words, the spring part 320 is arranged to be mounted in the space between two respective surfaces of the joined together panels, and the respective outsides 331, 341 of the spring part then abut against, and are pressed against the spring force, one respective panel surface each.

It is preferred that one 370 of the ends of the spring part 320 is free in relation to both the joined together panels, so that the spring part 320 can be flattened against the spring force under the pressure from the panels, and thereby be extended in a direction of movement 361 which is parallel to the direction of elongation 360.

Since the respective outsides 331 and 341 of all crests 330 and valleys 340 in this way are pressed towards the respective panel surfaces, a contact point between the spring part and a certain one of the two panels will result at each crest and valley, respectively. The electric contacting will be good, as a consequence of the small contact surface between spring part and panel surface in combination with the spring force pressing together spring and panel surface. Moreover, the electric contact will be mediated by the material of the spring part. By varying the period of the wave-shape of the spring part, high quality contact points with a certain predetermined maximum mutual interval can be achieved, so that the shielding of the cover with respect to electromagnetic disturbance becomes efficient across a certain predetermined frequency interval.

According to the invention, the surface of the spring part on which the outsides 331 of the crests are arranged is provided with one or several projections 332. Such a projection is arranged at least at one, but preferably a plurality, most preferably all, crests 330, so that each projection 332 extends outwards from the outsides of the spring part crests along the spring force direction 362, and so that the distal end of each projection facing away from the spring surface 331 projects further out from the spring part than does the surface itself, without projections. In other words, the panel which is arranged to abut against the respective outsides 331 of the crests will abut against the respective exterior surfaces of the projection or projections 332, instead of the surface 331 when the spring part is mounted in the connector. The exterior surfaces of the projections are arranged with a smaller contact area against the panel surface than the contact area resulting in the case with no projections.

The projections 332 give rise to a large contact pressure between the spring part and the panel surface at the point of contact, which guarantees good electric contacting even in case dirt and the like exists on the respective surfaces.

The second end 312 of the spring part 320 is arranged with a hook part 311, arranged to grip around a corresponding edge on a panel along which the first panel is arranged to be slidable. When the hook 311 thus grips around the edge, the hook 311 cannot be displaced in the direction of movement

361 in relation to the surface of the panel having the edge. On the other hand, the free end 370 can still move in relation to the panel. Thus, the spring part 320, even if retained in relation to the surface of the panel with the hook at the place where the hook grips the edge, is movable in relation to the panel surface in the meaning that the free end of the spring part is movable, why the spring part can be flattened and thereby extended when compressed against its spring force. In this case, the extension takes place by the projections 332 sliding along the surface of the panel arranged with the edge as the spring part is compressed between the panel surfaces.

At the same time, the hook part 311 and the corresponding edge are preferably so formed so that the engagement when the hook grips around the edge admits movement of the spring part 320, and thereby the contacting device, in the direction which is opposite to the direction of movement 361.

According to the invention, the edge around which the hook part 311 is arranged to grip belongs to a panel which is arranged to abut against the projections 332 when the spring part 320 is mounted in the connector.

The contacting device 310 is preferably made in the form of one single, connected part, whereby the hook part 311 is a U-shaped portion in one end of the wave-shaped spring part 320.

According to the invention, at least one, rather a plurality, most preferably all, projections 332 are arranged to display relatively low sliding friction against the surface of the panel having the edge when the spring part 320 is caused to slide against the latter in the direction of movement 361, and relatively high sliding friction when the spring part is caused to slide against the panel surface in the opposite direction. Moreover, the relatively high sliding friction is higher than the sliding friction between the surface of the second panel and the side of the spring part facing towards this surface, that is the respective outsides 341 of the valleys 340, when the spring part 320 is compressed between the two panel surfaces.

The expression "relatively low sliding friction" and "relatively high sliding friction" herein refer to that the relatively low sliding friction is lower than the relatively high sliding friction when the spring part is mounted in its compressed state in the connector.

According to a preferred embodiment, at least one, rather a plurality, most preferably all, projections 332 are arranged in the form of a prickle, pressed out from the spring part 320 material, facing in a direction opposite to the direction of movement 361, and comprising a flange 333 with an inclined part 333b which is terminated in a sharp edge 333a. The design of the prickle is most clearly illustrated in FIGS. 3b, 3c and 3e, and comprises a side 332a with relatively low friction and a side 332b with relatively high friction. When the prickle is caused to slide against the panel surface in the direction of movement 361, it will display relatively low friction, because of the sharp edge 333a facing in the opposite direction and since the inclined part 333b can be dragged along the panel surface. When it, on the other hand, is caused to slide along the panel surface in the opposite direction, the sharp edge 333a will engage with the material of the panel surface, resulting in relatively high friction.

Such a design of the projections 332 will in a cost-efficient and reliable manner result in the desired friction properties during sliding in different directions. However, it is realized that the projections 332 can also be designed in other ways, as long as these friction properties are achieved.

A design of the spring part with the above described projections in combination with smooth outside 341 surface at the valleys 340 has proven to make possible that the friction during sliding of the outsides 341 of the valleys 340 against the panel having no edge is lower than the relatively higher friction, especially when the panel surface which is arranged to abut against the outsides 341 of the valleys is comprised by a narrow edge surface of the panel in question (see below).

Figure 4A:
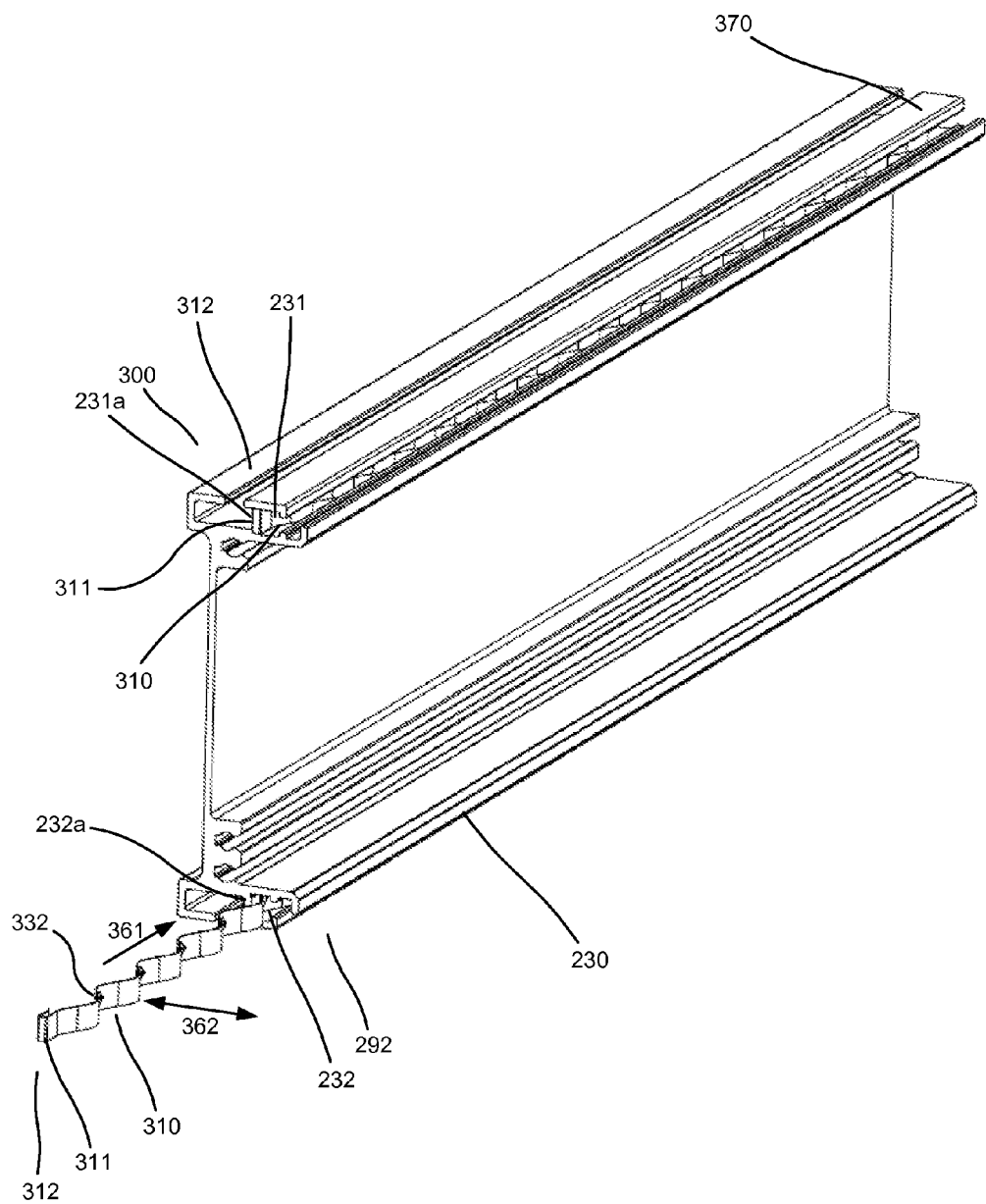
FIG. 4a is a perspective view of a side panel.

FIG. 4a illustrates the side panel 230. The panel 230 comprises elongated channels 231, 232, constituting respective grooves for side edges of top panel 210 and bottom panel 220. Thus, the channels constitute parts of the corresponding connector 300, 292 for joining together of the side panel 230 and the top panel 210 and bottom panel 220, respectively.

Channels 231, 232 are arranged to receive and accommodate one contacting device, in the form of a hook spring device 310 in accordance to the above said, each, so that the hook spring device runs along the channel in parallel to the main direction of elongation of the panel. Each channel is arranged with a respective edge 231a, 232a around which the hook 311 of the respective spring device can grip.

The channels 231, 232 are open in a direction towards the interior 294 of the cover 200 (see FIG. 2b). Into and in parallel with the respective channel, a respective elongated edge part of an adjacent panel is arranged to be insertable, together and in parallel with the hook spring device 310.

Figure 4B:
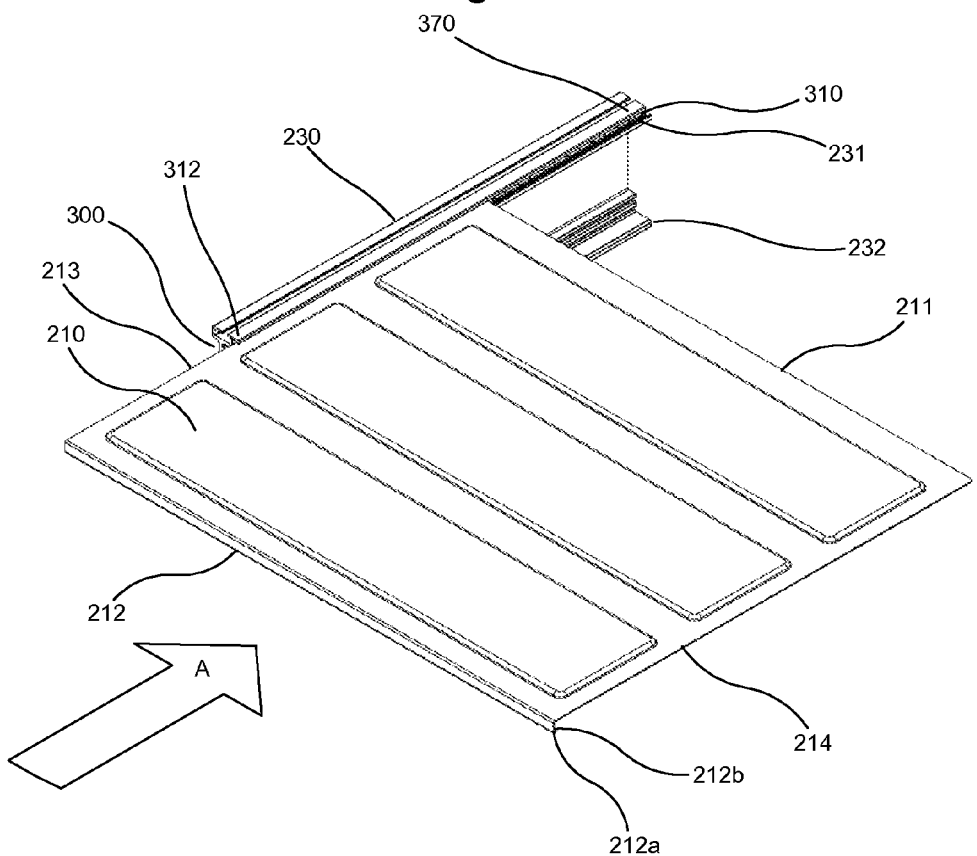
FIG. 4b is a perspective view of a side panel and a top panel.
Figure 4C:
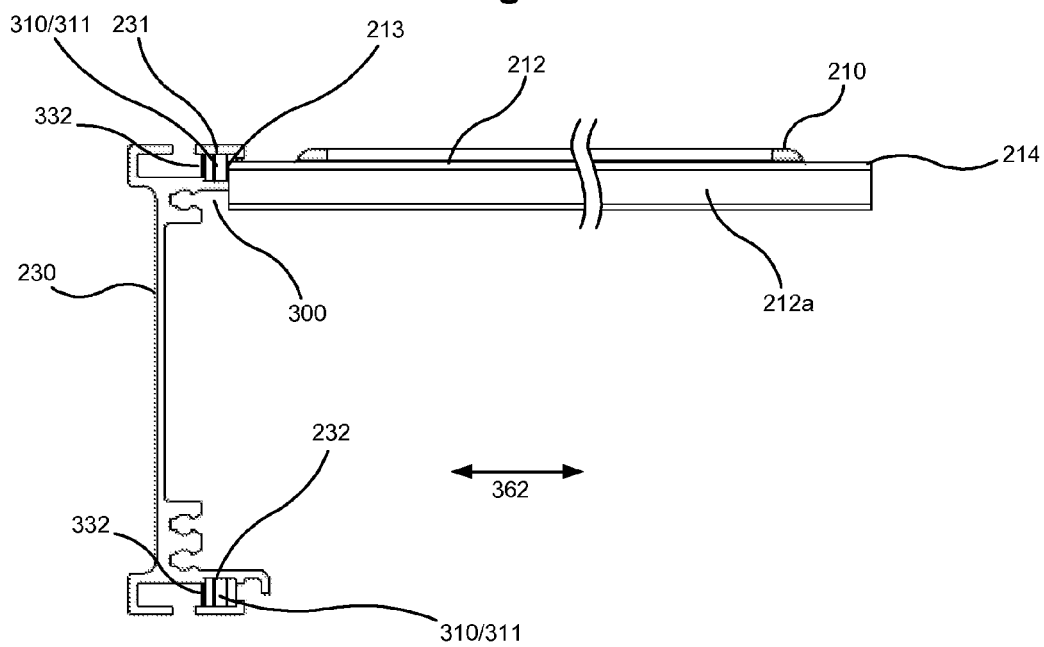
FIG. 4c is a side view of the side panel and the top panel of FIG. 4b as seen from A.
Figure 4D:
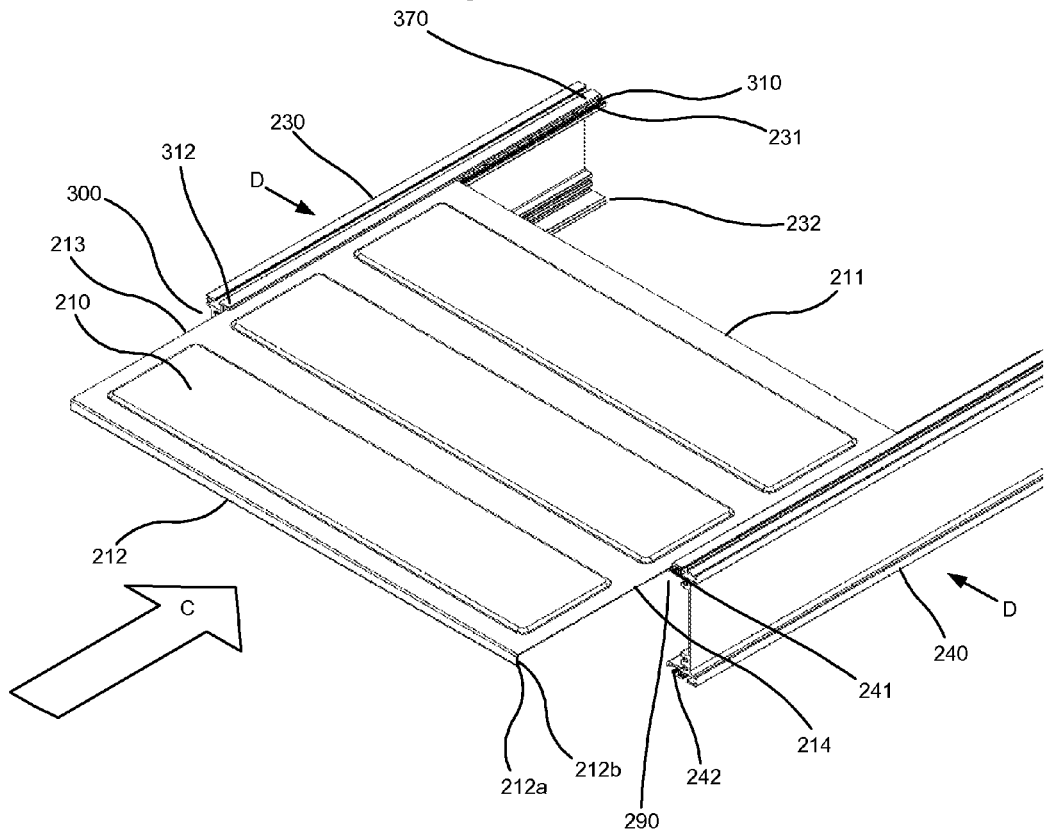
FIG. 4d is perspective view of two side panels and a top panel.
Figure 4E:
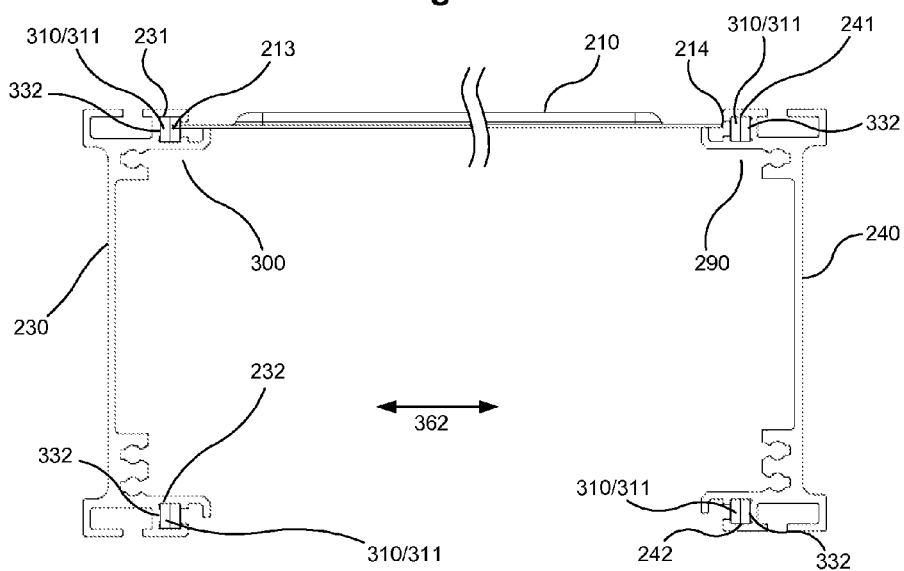
FIG. 4e is a cross-sectional view of the side panels and the top panel of FIG. 4d as seen from C along a section D.

This is illustrated in FIGS. 4b and 4c, wherein it is shown that the top panel 210 is arranged with a side edge 213 being insertable into the channel 231 together with the hook spring 310. In FIGS. 4d and 4e, the corresponding configuration is shown, but now with both side panels 230 and 240, comprising two channels each 231, 232, 241, 242 for engagement with top and bottom panels. The side panels are illustrated in engagement with one elongated edge 213, 214 of the top panel 210 each. The side panels are arranged in parallel with each other, to admit sliding of the top plate between the side panels.

As is most clearly shown in FIG. 4e, the connectors 290, 300 are arranged to mechanically join together the pairs of panels 230, 310 and 240, 210, respectively, when the respective side edges 213, 214 of the top panel are inserted into the respective channel 231, 241. The mechanical joining together can be completed by engagement between the panels 210, 230, 240 and other, in FIGS. 4c-4e not shown panels.

When the respective side edge 213, 214 is inserted into the respective channel 231, 241 together with the spring part 320, the respective outsides 331 of the spring part crests 330, in other words the respective exterior surface of the projections 332, are arranged to abut against an inner surface of the channel, which inner surface is arranged at a distance from the side edge when the latter is mounted in the channel. At the same time, the respective outsides 341 of the spring part valleys 340 are arranged to abut against the side edge 213, 214. The dimensions of the constituting parts 210, 213, 214, 231, 241, 310, 332 are selected so that the spring part 320 against is flattened its spring force during the insertion of the elongated side edge part into the channel.

Hence, during assembling of the top panel, a respective contacting device in the form of a hook spring 310 is firstly inserted in each of the channels 231, 241, so that their respective hook 311 grips around a respective edge 231a. Thereafter, the top panel 210 is inserted in the direction 361 of motion of the hook springs (see FIG. 4a), in between the side panels 230, 240, so that the side edges 213, 214 of the top panel are inserted into and along the respective channels 231, 241 together with a respective hook spring 310 each. As the motion in the direction of motion 361 of each hook spring is limited by its hook part, the hook spring is not carried along by the side edge of the top panel. Instead, it is pressed outwards from the respective side edge 213, 214, towards the inside of the channel and against the direction 362 of the spring force, so that the side edge is pressed against the inside of the channel.

This will the result in the hook spring being extended by its free end 370 being displaced in the direction of elongation 361. This displacement takes place without problems, since the friction between the projections 332 and the inside of the channel is low in the direction of motion.

Figure 4F:
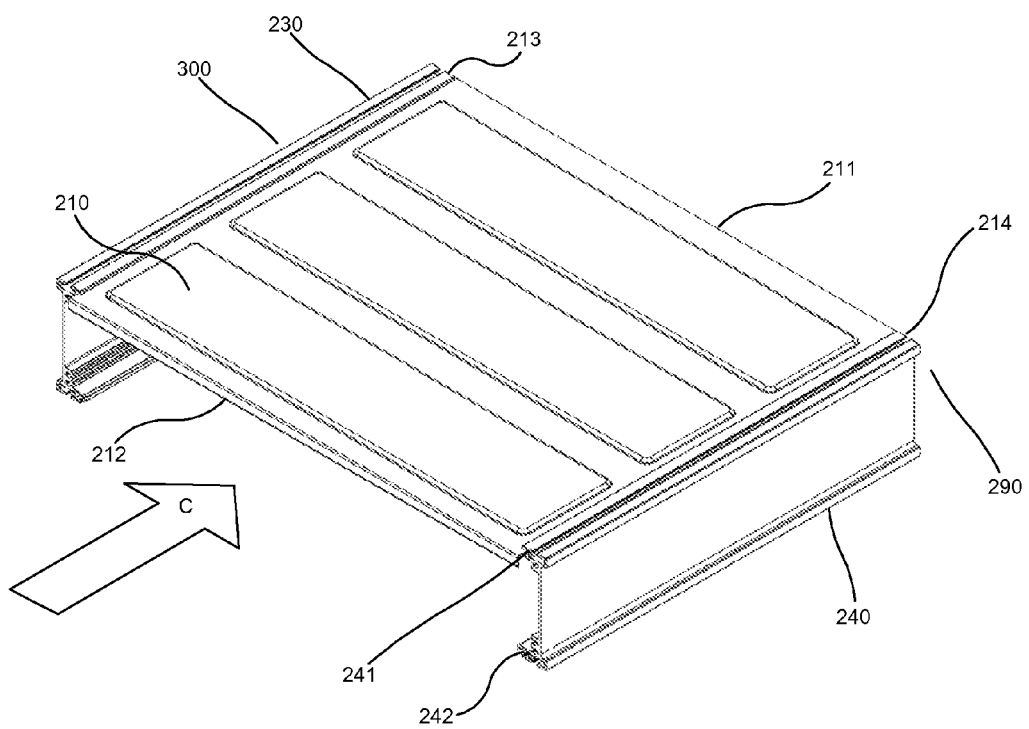
FIG. 4f is a perspective view of two side panels and a top panel.

Finally, the fully pushed in position of the top panel 210 which is illustrated in FIG. 4*f* is achieved. In this position, the top panel may be fixed using fixing means (not shown in FIG. 4*f*).

When the top panel 210 is again pulled out, the friction between the projections 332 and the inside of the respective channel 231, 241 will be higher than during the pushing in step, see above. Since the friction between the outsides 341 of the respective spring part 320 valleys 340 and the side edge 213, 214 of the respective top panel 310 is lower than the friction between the projections and the inside of the respective channel during motion of the hook spring 310 against the direction of motion 361, the spring will be retained in its position in the channel, except that the part of the spring comprising its free end 370, which is no longer loaded, will be pulled together and become shorter, why the free end to a certain extent will move in the direction of motion 361. This can take place without risking that the spring is compressed to lock the top panel. When the top panel is then completely pulled out, the hook springs hence remain in the same location as before the top panel was first pushed in. In this position, they can easily be removed from their respective channel by simply pulling them out by the hook 311.

Since the pointed projection 332 of the hook spring 310 abuts, under the spring force and with a small contact surface, against the inside of the channel 231, 241, good electric contacting between side panels 230, 240 and hook spring is achieved. At the same time, the outside of the hook spring valleys abut, under spring force, against the side edge 213, 214 of the top panel 210, which side edge is preferably narrow whereby a small contact surface is also created between hook spring and top panel with corresponding good electric contacting. Thus, there is good contacting between the side panels and the top panel. Furthermore, the points of contact are distributed at predetermined maximum distances, preferably at even distances, along the both respective connectors 290, 300, which gives good and well-controlled shielding properties.

It is preferred that the top panel 210 is shaped as a sheet, the side edge or edges 213, 214 of which is or are essentially thinner than the width in the compression plane of the hook spring 310.

The construction of the bottom panel 220 can advantageously be similar to the one of the top panel 210.

According to a preferred embodiment, each individual contacting device extends along at least half of the joint between the joined together panel elements, more preferably along the whole joint except along a part of the joint near the end of the connector, where the panels are joined together in another way than using a spring part, such as for example using a bolted joint comprising a screw 270, preferably a single bolted joint. Most preferably, the contacting device extends along essentially the whole of the joint.

Furthermore, it is preferred that, for the spring part of each individual contacting device, the largest distance between two adjacent points of contact, between a certain spring part and a panel associated with the spring part, nowhere is larger than 20 mm. This means that the distance between two consecutive crests and valleys, respectively, is not more than 20 mm for all crests and all valleys.

In case the contacting device extends along essentially the whole joint, it is also preferred that the part which possibly is not covered by the contacting device is arranged at one or both of the ends of the connector, and that such a part is not more than 20 mm of length. In case the contacting device extends along the whole joint except for a part near the end of the connector, it is preferred that the distance between the additional connection point arranged in the end and contacting device is not more than 20 mm.

Furthermore, and according to a preferred embodiment, the various panels in the cover are formed as rectangles, and at least two connectors comprise hook spring parts 320 of the above described type. In this case, at least two of these hook spring parts 320 are arranged in parallel. This results in that a top panel 210 and/or a bottom panel 220 can be pushed in between two side panels 230, 240 as described above, thus easily and quickly yet with good contact sealing the cover 200 in a reopenable fashion.

It is especially preferred that the cover 200 is assembled by all other constituting panels 220, 230, 240, 250, 260 firstly being joined together in the above described way, and that the top panel 210, in the form of a top plate, thereafter is pushed in, with its front edge 211 first, as a result of the top panel 210 side edges 213, 214 being guided in the grooves 231, 241 arranged in the adjacent side panels 230, 240, so that a closed cover 200 is thus established. In this case, it is also preferred that the top plate comprises the U-shaped projection 212*a*.

All the above described components are preferably of metal, in order to maximize the contacting between the parts.

According to a preferred embodiment, all panels in the cover 200 are made from aluminum, which gives good shielding properties. It is especially preferred that each panel 230, 240 comprising an open channel 231, 232, 241, 242 for a wave-shaped spring 320 is made as an aluminum profile with constant cross-section. This results in a simple, cheap yet robust construction with good shielding properties.

As regards hook spring parts 320 and screws 270, it is preferred that these are made from stainless steel. Spring parts 320 are preferably made from spring steel.

A cover according to the present invention thus yields efficient and well-controlled shielding of electromagnetic disturbance across a broad spectrum of disturbing frequencies.

Furthermore, this is accomplished at a relatively low cost, and in a way admitting simple assembling, disassembling, opening and closing. Moreover, the shielding properties can be controlled by replacing the constituting spring elements to new spring elements with smaller or larger distances between the points of abutment against the panels.

Above, exemplifying embodiments have been described. However, it is apparent to the skilled person that many modifications may be made to the described embodiments without departing from the idea of the invention.

For example, the cover can assume other geometric shapes using the above described contact principles. For example, the cover can be shaped as a rectangular parallelepiped, the height of which is larger than the sides of its basis surface, or having partly open sides. Other geometric shapes than a rectangular parallelepiped can of course also be used. Alternatively, the cover can be designed with fewer than six in relation to each other movable panels, so long as at least one panel is arranged to be joined together with the rest of the parts in the cover using contacting devices according to the above said. Finally, other types of contacting devices can be used in combination with the herein described contacting devices.

Thus, the invention shall not be limited to the described embodiments, but can be varied within the frame of the enclosed claims.

The invention claimed is:

1. Cover (200) for an electronic equipment, which cover comprises a first and a second metal panel element (210,220, 230,240), where respective first and second metal surfaces of the said panel elements are arranged to be mechanically joined together with good electric contacting using a connector (290,292,300) comprising a contacting device (310), wherein the contacting device comprises:
   a) an elongated metal compression spring part (320), associated with a direction of elongation (360) and also a direction of motion (361) along the said direction of elongation, which spring part (320) is wave-shaped whereby it comprises a plurality of alternating crests (330) and valleys (340), so that the spring part is arranged to be compressed, against the spring force, between the two respective metal surfaces in a press plane which is perpendicular to the direction (362) of the spring force, whereby the outsides (331) of the crests are pressed against the first metal surface and the outsides (341) of the valleys are pressed against the second metal surface;
   b) a hook part (311) arranged on the spring part, arranged to grip around an edge (231a,232a) of the first panel element (230,240) and thereby, when it grips around the edge, prevent that the part of the contacting device being retained by the hook part is displaced in the said direction of movement in relation to the first metal surface; and
   c) at least one projection (332), arranged on a surface facing the first metal surface when the hook part grips around said edge, which projection is arranged to display relatively low sliding friction against the first metal surface when the spring part is caused to slide against the first metal surface in the said direction of motion and a relatively high sliding friction when the spring part is caused to slide in the opposite direction, where the latter relatively high sliding friction is higher than the sliding friction between the side of the spring part facing the second metal surface and the second metal surface when the spring part is compressed between the two metal surfaces.

2. Cover (200) according to claim 1, wherein, for all crests (330) and all valleys (340), the distance between two adjacent crests and two adjacent valleys, respectively, is no more than 20 mm.

3. Cover (200) according to claim 1, wherein the hook part (311), when gripping around the edge (231a,232a), admits movement of the contacting device (310) in the direction which is opposite to the said direction of motion (361).

4. Cover (200) according to claim 1, wherein the contacting device (310), even if retained in a fixed position in relation to the first metal surface at the place for the gripping of the hook part (311), around the panel element (230,24) edge, is movable in relation to the first metal surface in the sense that the spring part (320) has at least one free end (370) and can be flattened and thereby extended when compressed against the spring force (362), and in that at least one projection is arranged to slide along the first metal surface when the spring part is compressed between the metal surfaces.

5. Cover (200) according to claim 1, wherein the hook part (311) is arranged at the near end of the spring part (320) in said direction of motion (361).

6. Cover (200) according to claim 1, wherein the projection (332) is arranged on the surface of the spring part (320) at a place on a crest (330) and closest to the first metal surface when the contacting device (310) is compressed between the two metal surfaces.

7. Cover (200) according to claim 6, wherein the projection (332) is arranged in the form of a prickle, pressed out from the spring part (320) material and facing in a direction which is opposite to the said direction of motion, which prickle is arranged to be caused to slide against the first metal surface, with relatively low friction, in the said direction of motion (361), and which is arranged to engage with the material of the metal surface, with resulting relatively high friction, when the contacting device (310) is pulled in the opposite direction.

8. Cover (200) according to claim 6, wherein a plurality of the crests (330) of the spring part (320) are arranged with respective projections (332).

9. Cover (200) according to claim 1, wherein the spring part (320) is made from stainless steel, preferably spring steel.

10. Cover (200) according to claim 1, wherein a panel element (230,240) comprises an elongated channel (231,232, 241,242) in which the contacting device (310) can be inserted, in that another panel element (210,220) comprises an elongated part (213,214) which can be inserted into the channel together and in parallel with the contacting device, and thereby to mechanically join together the two panel elements, in that, when the elongated part is inserted into the channel together with the spring part, the respective outsides (331) of the spring part crests (330) are arranged to abut against an inner surface of the channel, and the respective outsides (341) of the spring part valleys (340) are arranged to abut against the elongated part, and in that the dimensions of the constituting parts are selected so that the spring part of the contacting device is flattened against the spring force when the elongated part is inserted into the channel.

11. Cover (200) according to claim 10, wherein the panel element (210,220) which comprises the elongated part (213, 214) is in the form of a sheet, the side edge of which constitutes the elongated part, in that the second metal surface, in the form of the side edge, is arranged to be pressed against the valleys (340) of the spring part, and in that the side part is thinner than the width of the spring part (320) in the press plane.

12. Cover (200) according to claim 1, wherein the cover comprises at least two said connectors (290,292,300), wherein a first panel element (230) and a second panel element (240), respectively, of the cover both constitute the first panel element in one respective connector each, and wherein a third panel element (210,220) constitutes the second panel element in both connectors, in that the first and second panel elements are arranged in parallel and on opposite sides of the cover and arranged with a respective channel (231,232,241, 242) each, in which channels two respective elongated parts (213,214), each arranged along a respective side edge of the third panel element, are arranged to be inserted, so that the third panel element can be inserted between the first and second panel elements and thereby be joined together with the first and second panel elements using the two connectors.

* * * * *